United States Patent [19]

Kobayashi et al.

[11] Patent Number: 5,267,211
[45] Date of Patent: Nov. 30, 1993

[54] MEMORY CARD WITH CONTROL AND VOLTAGE BOOSTING CIRCUITS AND ELECTRONIC APPLIANCE USING THE SAME

[75] Inventors: Ichiro Kobayashi; Atsushi Yamada; Noriaki Sakurada, all of Nagano, Japan

[73] Assignee: Seiko Epson Corporation, Tokyo, Japan

[21] Appl. No.: 838,713

[22] PCT Filed: Aug. 23, 1991

[86] PCT No.: PCT/JP91/01121
§ 371 Date: May 12, 1992
§ 102(e) Date: May 12, 1992

[87] PCT Pub. No.: WO92/03298
PCT Pub. Date: May 3, 1992

[30] Foreign Application Priority Data

Aug. 23, 1990 [JP] Japan .................... 2-221939

[51] Int. Cl.$^5$ .............................. G11C 5/14
[52] U.S. Cl. ........................ 365/228; 365/229
[58] Field of Search ................... 365/228, 229

[56] References Cited

U.S. PATENT DOCUMENTS

| | | | |
|---|---|---|---|
| 4,654,829 | 3/1987 | Jiang et al. | 365/229 |
| 4,712,195 | 12/1987 | Finger | 365/229 |
| 4,912,346 | 3/1990 | Mizuta | 365/228 |
| 5,046,052 | 9/1991 | Miyaji et al. | 365/229 |
| 5,058,075 | 10/1991 | Mizuta | 365/229 |
| 5,153,855 | 10/1992 | Konishi | 365/229 |
| 5,168,206 | 12/1992 | Jones | 365/229 |

FOREIGN PATENT DOCUMENTS

| | | | |
|---|---|---|---|
| 60-140413 | 7/1985 | Japan | 365/229 |
| 60-163120 | 8/1985 | Japan | 365/229 |
| 63-20590 | 1/1988 | Japan . | |
| 63-286991 | 11/1988 | Japan . | |
| 63-291188 | 11/1988 | Japan . | |
| 1-288984 | 11/1989 | Japan . | |
| 2-50285 | 2/1990 | Japan . | |

*Primary Examiner*—Eugene R. LaRoche
*Assistant Examiner*—Michael C. Kessell
*Attorney, Agent, or Firm*—Ladas & Parry

[57] ABSTRACT

A memory card mounted with a storage device and an electronic appliance using such a memory device. The memory card has an RAM (36), a battery (38), a voltage converter (40) for boosting a voltage of the battery and for outputting the boosted voltage, and a switching circuit (42) for receiving an output voltage of the voltage converter and an externally supplied voltage and for supplying one of the received voltages to the RAM as a driving voltage therefor, so that a voltage higher than the battery voltage is supplied to the RAM at the time of backup to thereby reduce soft errors.

14 Claims, 6 Drawing Sheets

MEMORY CARD WITH CONTROL AND VOLTAGE BOOSTING CIRCUITS AND ELECTRONIC APPLIANCE USING THE SAME

DESCRIPTION

1. Technical Field

The present invention relates to a memory card mounted with a storage device and an electronic appliance using such memory card, and particularly relates to reduction of soft errors.

2. Background Art

In a conventional memory card, an externally supplied source voltage was applied to a storage device, for example, a RAM, built in the memory card in use of the memory card, while in not-use, the storage device was backed up by a battery built in the memory card so as to maintain the data stored therein. In such a backup state, however, the rate of occurrence of soft errors was high in comparison with that in use of the memory card so that an electronic appliance mounted with the memory card operated erroneously or the stored data became changed.

By the way, soft errors are temporary errors having no reproducibility, and soft errors caused by $\alpha$ rays have come into serious problems affecting the reliability of memory elements. Soft errors due to $\alpha$ rays are caused when $\alpha$ particles, which are produced when a very fine quantity of radioactive isotope uranium (U) or thorium (Th) included in a package or the like $\alpha$-decays, come into the surface of a memory chip. The incident $\alpha$ particles produce a number of electron and positive-hole pairs in the vicinity of the chip surface, so that the electrons concentrate in a memory cell to thereby break the information of the memory cell.

DISCLOSURE OF INVENTION

It is an object of the present invention to provide a memory card in which the rate of occurrence of above-mentioned soft errors at the time of backup is reduced.

It is another object of the present invention to provide an electronic appliance mounted with a memory card in which the rate of occurrence of soft errors is reduced.

The present invention is based on the knowledge that the larger the voltage applied to memory elements, the more reduced the rate of occurrence of soft errors, and the present invention has been attained in the circumstances that the upper limit of the voltage value of batteries applicable to devices such as memory cards which are restricted in fixing conditions is 3V at present and there exists no buttery having an output voltage higher than 3V.

According to an aspect of the present invention, the memory card comprises an RAM, a battery, a voltage converter for boosting a voltage of the battery and for outputting the boosted voltage, and a switching circuit for receiving an output voltage of the voltage converter and an externally supplied voltage and for supplying one of the output voltage of the voltage converter and the externally supplied voltage to the RAM as a driving voltage therefor. For example, in the state where the memory card has been removed from an electronic appliance, the external voltage is not supplied so that the switching unit supplies the output voltage of the voltage converter, that is, the output voltage obtained by boosting the voltage of the battery, to the RAM as a backup voltage therefor. As has been described, at the time of backup, a voltage higher than the voltage of the battery is supplied to the RAM as a backup voltage therefor, so that soft errors can be reduced on a large scale.

Further, according to another aspect of the present invention, the memory card comprises a voltage monitor for supervising the externally supplied voltage so as to bring the voltage converter into an operation inhibition mode when the externally supplied voltage is equal to or higher than a predetermined value. Since the voltage converter does not have to operate at any time other than the time of backup, the operation of the voltage converter is inhibited when the memory card is driven by an electronic appliance to thereby realize low power consumption.

Further, according to another aspect of the present invention, the voltage converter includes a clock generator circuit for generating a clock signal, and a voltage converter circuit for receiving the clock signal and for boosting the voltage of the battery.

Further, according to another aspect of the present invention, the voltage converter includes a stabilizer circuit for stabilizing the output voltage of the voltage converter circuit to thereby supply a stable backup voltage.

Further, according to another aspect of the present invention, the voltage converter includes a voltage detector circuit for detecting the output voltage of the voltage converter circuit and for comparing the detected output voltage with a predetermined reference value, and a controller circuit for blocking or passing a clock signal on the basis of the output of the voltage detector circuit.

Further, according to another aspect of the present invention, the voltage converter includes a controller circuit for detecting the output voltage of the voltage converter circuit, for comparing the detected output voltage with a predetermined reference value, and for controlling the clock generator circuit on the basis of the result of the comparison to thereby supply a backup voltage. For example, the controller circuit controls the on-off operation or oscillation frequency of the clock generator circuit. Alternatively, the controller circuit may control the pulse width of the clock generator circuit.

Further, according to another aspect of the present invention, the clock generator circuit includes a voltage stabilizing circuit for lowering the battery voltage, and an oscillator circuit driven by the voltage stabilizing circuit. It is intended not only to stabilize the driving voltage for the oscillator circuit but also to make the power consumption low by driving the oscillator circuit with a low voltage.

Further, according to another aspect of the present invention, an electronic appliance is mounted with such a memory card as described above, and supplies a driving voltage to the memory card, so that data is transferred between the appliance and the memory card through an interface.

BEST MODE FOR CARRYING OUT THE INVENTION

Figure 1:
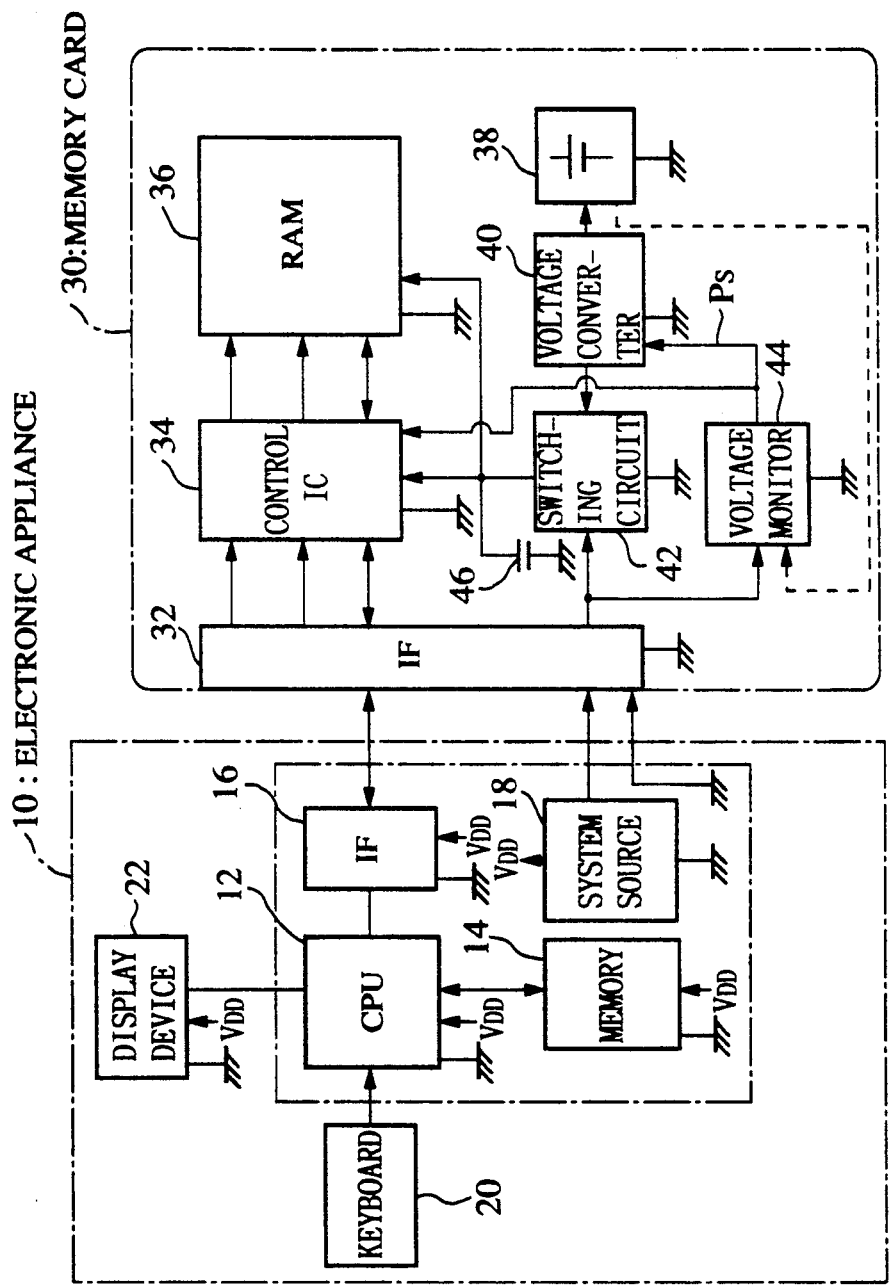
FIG. 1 is a block diagram illustrating the construction of a memory card of an embodiment of the present invention and an electronic appliance using the same.

An electronic appliance 10 shown in FIG. 1 includes a CPU 12, a storage device 14, a memory card interface circuit 16, a system source 18, a keyboard 20 and a display device 22. The CPU 12 performs a predetermined operational processing in accordance with a program stored in the storage device 14, for example, so as to supply an access signal to a memory card 30 through the memory card interface circuit 16 to thereby fetch various data which will be described later. The CPU 12 performs other operational processings to fetch input data from the keyboard 20, to supply the result of operation to the display device 22 to make the display device 22 display the operation result, and so on. On the basis of an external source, a built-in battery, or the like, the system source 18 supplies a system source voltage, as a driving voltage, to the CPU 12, the storage device 14, the memory card interface circuit 16 and the display device 22.

In the case where the display device 22 is a liquid crystal display device, here, a high voltage different from the voltage for the CPU 12 and so on is often required, and there is therefore a case where the system source 18 is boosted to produce another high voltage which is made to be another source for only the display device 22.

The memory card 30 is loaded into the electronic appliance 10 so that data is read therefrom or written therein in accordance with the access from the electronic appliance 10. This memory card 30 is provided with an interface 32, a control IC 34, an RAM 36, a battery 38, a voltage converter 40, a switching circuit 42 and a voltage monitor 44. A capacitor 46 is connected to the output side of the switching circuit 42.

The interface 32 of the memory card 30 receives an address signal and a control signal from the CPU 12 through the memory card interface circuit 16, transfers data between the interface 32 and the CPU 12, and receives supply of a voltage (for example, of 5 V) from the system source 18. The address signal, the control signal and the data signal received from the CPU 12 through the interface 32 are transmitted to the RAM 36 through the control IC 34. In the case where the RAM 36 is constituted by a plurality of memory ICs, the control IC 34 shares the received control and address signals to the respective memories so as to separately control the respective memory ICs so as to make the memory ICs operative or inoperative at the time of reading/writing. On the other hand, even in the case where the RAM 36 is constituted not by a plurality of memory ICs, the control IC 34 performs timing adjustment of the control signal, the address signal, the data signal, and so on to thereby prevent the memory card from operating erroneously at the time of switching the source when the supply of the system source 18 to the memory card is stopped or started as will be described later. Further, the control IC 34 has an operation inhibition mode so that in the operation inhibition mode, the control IC 34 brings at least the RAM 36 into a write inhibition mode.

Then, data is read out from a specified area of the RAM 36 on the basis of the control signal and the address signal, or data is written into a specified area of the RAM 36 on the basis of the control signal and the address signal.

A voltage (for example, of 5 V) supplied from the system source 18 through the interface 32 is applied to the switching circuit 42 and the voltage monitor 44. The voltage monitor 44 detects the voltage from the system source 18, and when the detected voltage becomes equal to or lower than a predetermined value, the voltage monitor 44 brings the control IC 34 into an operation inhibition mode to thereby inhibit the driving for the control IC 34, and releases the voltage converter 40 from an operation inhibition mode so as to allow the driving for the voltage converter 40. The voltage of the battery 38 is boosted by the voltage converter 40, and supplied to the switching circuit 42. The switching circuit 42 receives the voltage from the system source 18 and the output voltage from the voltage converter 40, so that the switching circuit 42 supplies one of the received voltages to the control IC 34 and the RAM 36 as a source voltage therefor. The capacitor 46 is connected on the output side of the switching circuit 42 so as to prevent the output voltage from the switching circuit 42 from changing suddenly.

As a specific method for carrying out the switching circuit 42, it is possible and easy to realize it by using two diodes so that the voltage from the system source 18 and the output voltage from the voltage converter 40 are connected to the anodes of the respective diodes as the inputs to the switching circuit 42, the cathodes of the respective diodes being connected to each other to form the output of the switching circuit. Although the above-mentioned switching circuit 42 employs a system in which a higher one of the two voltages is made to be its output, it is possible to use another method in which control is made so that the input is switched compulsorily based on the output of the voltage monitor 44. In this case, it will do to use MOS transistors in place of the diodes, the respective gates of the MOS transistors being supplied with the output of the voltage monitor and an inverted signal of the output. Although it is necessary to provide a signal line to control the switching circuit 42 based on the output of the voltage monitor 44 in this other method, such a signal line is not illustrated in FIG. 1.

In the former method, there is an advantage that the switching circuit can be realized inexpensively, while in the latter method it is possible to surely connect the system source 18 to the control IC 34 and the RAM 36 independently of the output voltage of the voltage converter 40 when the system source 18 is supplied to the memory card so that the consumption of the battery 38 can be prevented.

In the electronic appliance 10 and the memory card 30 arranged as mentioned above, in the state where the memory card 30 has been loaded in the electronic appliance 10 and the voltage of the system source 18 is being supplied to the memory card 30 sufficiently, the voltage monitor 44 detects the voltage from the system source 18 which exceeds a predetermined value. Accordingly, the voltage monitor 44 releases the control IC 34 from the operation inhibition mode so that the control IC 34 can be driven, and at the same time the voltage monitor 44 brings the voltage converter 40 into the operation inhibition mode so that the voltage converter 40 can not be driven.

Figure 2:
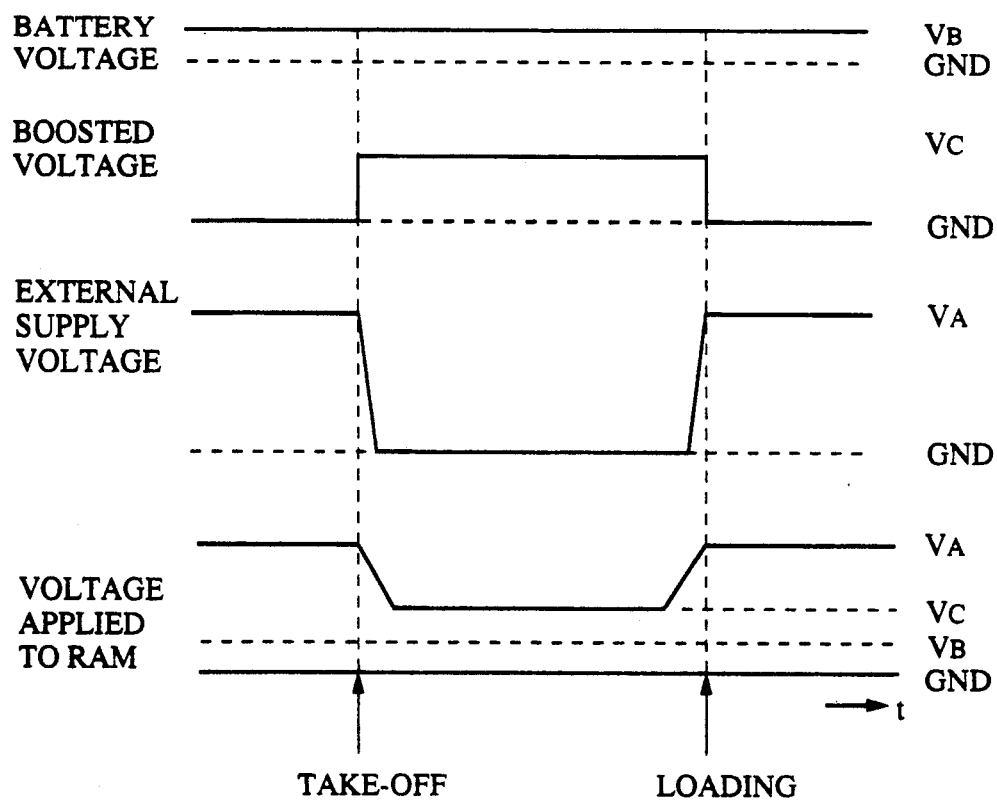
FIG. 2 is a timing chart illustrating the operation of the memory card of FIG. 1.

Therefore, through the switching circuit 42, the voltage from the system source 18 is supplied to the control IC 34 and the RAM 36. That is, the voltage $V_A$ is supplied to the control IC 34 and the RAM 36 as shown in FIG. 2. In the state of such a normal use, data is transferred between the CPU 12 and the RAM 36 through the memory card interface circuit 16 of the electronic appliance 10, and the interface 32 and the control IC 34 of the memory card 30.

Next, when the memory card 30 is removed from the electronic appliance 10, the voltage monitor 44 detects the voltage from the system source 18, and if the voltage is equal to or lower than a predetermined voltage value, the voltage monitor 44 judges the memory card 30 has been removed, and brings the control IC 34 into the operation inhibition mode, and releases the voltage converter 40 from the operation inhibition mode. As a result of release from the operation inhibition mode, the voltage converter 40 is driven so as to boost the battery voltage.

In the case where the electronic appliance 10 is not in use, that is, in the case where the source of the electronic appliance 10 has been turned off, the voltage from the system source 18 is not supplied to the memory card 30 even if the memory card 30 has not been removed, and the operation is the same as that in the above-mentioned case where the memory card 30 has been removed from the electronic appliance 10. In either case, since the voltage from the system source 18 is not being supplied to the memory card 30, the switching circuit 42 switches to the output voltage of the voltage converter 40 so as to supply the voltage boosted by the voltage converter 40 to the control IC 34 (IC 34 is however not driven because it is in the operation inhibition mode) and the RAM 36 as a backup voltage. At this time, charges are accumulated in the capacitor 46 by the voltage from the system source 18, so that the backup voltage supplied to the RAM 36 becomes low with a time constant corresponding to the capacitance of the capacitor 46 from the voltage of the system source 18 to the value of the output voltage of the voltage converter 40 as shown in FIG. 2, and thereafter the backup voltage becomes the value of the output voltage of the voltage converter 40.

If the memory card 30 is loaded to the electronic appliance 10 again, the voltage from the system source 18 is supplied to the memory card 30, and the switching circuit 42 switches to the voltage from the system source 18 so as to output this voltage. However, the voltage supplied to the RAM 36 increases with a time constant corresponding to the capacitance of the capacitor 46 as shown in FIG. 2. The other operation is the same as that in the loaded state which has been described first.

Further, although the voltage monitor 44 supervises the voltage of the system source 18 supplied from the outside and judges whether the voltage is not higher or lower than a predetermined detection voltage, it is possible to consider another method in which the voltage monitor 44 compares the size between the voltage of the system source 18 supplied from the outside and the voltage of the inside battery 38. An input signal line from the inside battery 38 to the voltage monitor 44 in this case is illustrated by the dotted line in FIG. 1.

Figure 3:
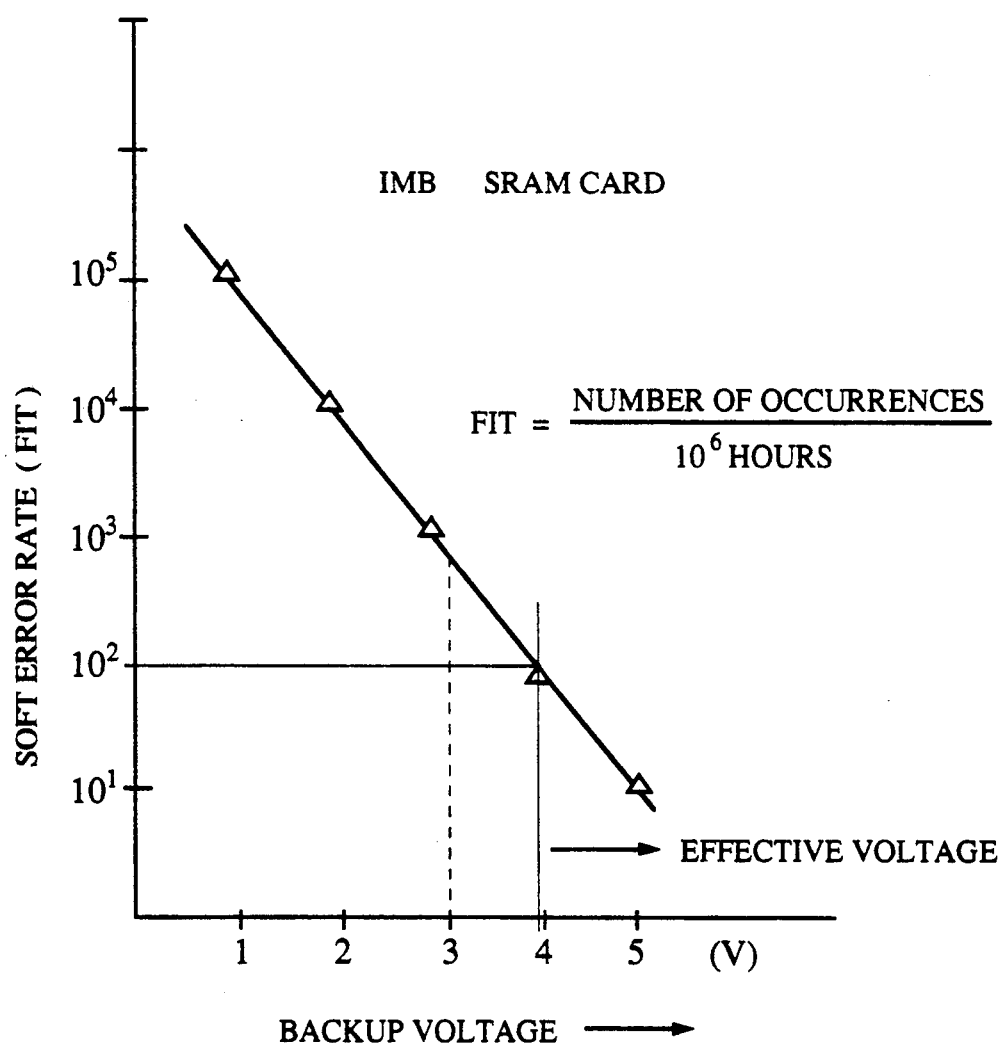
FIG. 3 is a characteristic diagram illustrating the relationship between the backup voltage and the soft error rate.

By making the backup voltage for the RAM 36 higher than the conventional voltage (3 V) as has been described, the rate of soft errors is reduced extremely, for example, as shown in FIG. 3. In order to restrain the soft error rate FIT (the number of occurrences per million hours) within $10^2$, it is necessary to make the backup voltage take a suitable value equal to or higher than 3.8 V.

Next, the configuration of the voltage converter 40 in FIG. 1 will be described. In the voltage converter 40 shown in FIG. 4, a voltage converter circuit 50 receives the voltage of the battery 38, receives a clock signal from a clock generator circuit 52 at the same time, and converts and outputs the voltage of the battery 38 as will be described later. A voltage stabilizer circuit 54 stabilizes the output of the voltage converter circuit 50 into a predetermined voltage value, and supplies the stabilized voltage to the switching circuit 44.

Here, the voltage stabilizer circuit 54 and the clock generator circuit 52 are controlled by the output of the voltage monitor 44 as shown in FIG. 1.

Figure 5:
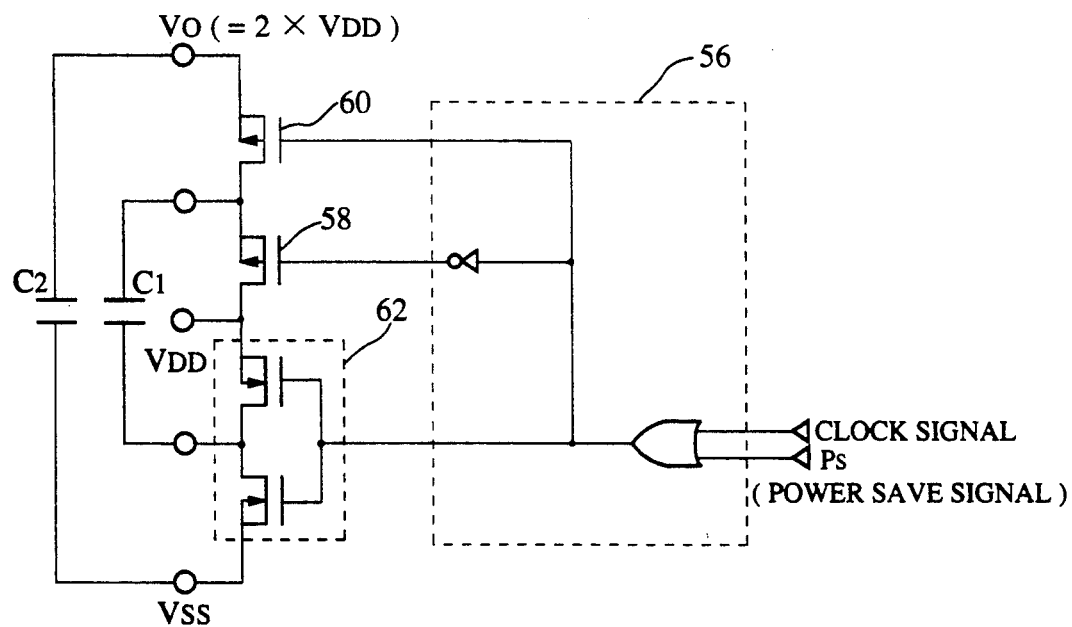
FIG. 5 is a block diagram illustrating the configuration of an embodiment of a voltage converter circuit.
Figure 6A:
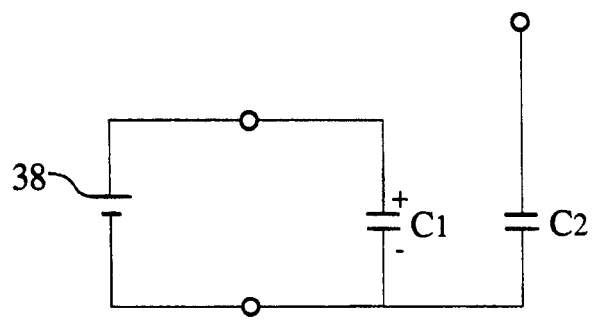
FIGS. 6A and 6B are explanatory diagrams illustrating the operation of the voltage converter circuit in FIG. 5.
Figure 6B:
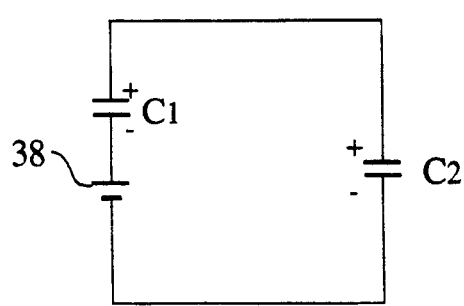

The voltage converter circuit 50 is constituted, for example, by a DC-DC converter shown in FIG. 5. The on-off operation of FETs 58 and 60 are controlled suitably on the basis of a clock signal from the clock generator circuit 52, and a driver 62 is switched by the clock signal to charge a capacitor C1, so that a double voltage can be obtained across a capacitor C2. That is, as shown in FIG. 6A, the capacitor C1 is charged with the battery voltage at first, and next the battery 38 and the capacitor C1 are connected in series and the capacitor C2 is connected in parallel to the series connection of the battery 38 and the capacitor C1 so that the capacitor C2 is charged. By repeating this operation, the sum of the battery voltage and the voltage of the capacitor C1, that is, a voltage two-times as high as the battery voltage is obtained across the capacitor C2, and extracted as an output.

If this circuit consumes a predetermined current, the output becomes lower than the voltage two-times as high as the battery voltage. If the performance of the respective FETs and the switching frequency or switching period are suitably adjusted, the circuit may be adjusted to a suitable voltage value not higher than the voltage two-times as high as the battery voltage even if the voltage stabilizer circuit 54 is not provided. Here, a signal Ps is an output signal of the voltage monitor 44 in FIG. 1, which is the same as the control signal in FIG. 4, and by which it is intended to make power consumption low at the inoperative time of the voltage converter circuit 50. This operation of the signal Ps applies to the cases of FIGS. 7 to 9. Further, in the practical switching operation of the FETs 58 and 60, which is not shown in the drawings, it is intended to make power consumption low by providing a phase difference in on-off control signals for switching transistors to thereby preventing a through current from flowing.

The voltage converter circuit 50 is not limited only to the above-mentioned embodiment (the charge pump system capacitor boosting circuit), but the voltage converter circuit 50 which is, for example, a step-up switching regulator using an inductor may be applied to the present invention.

Figure 7:
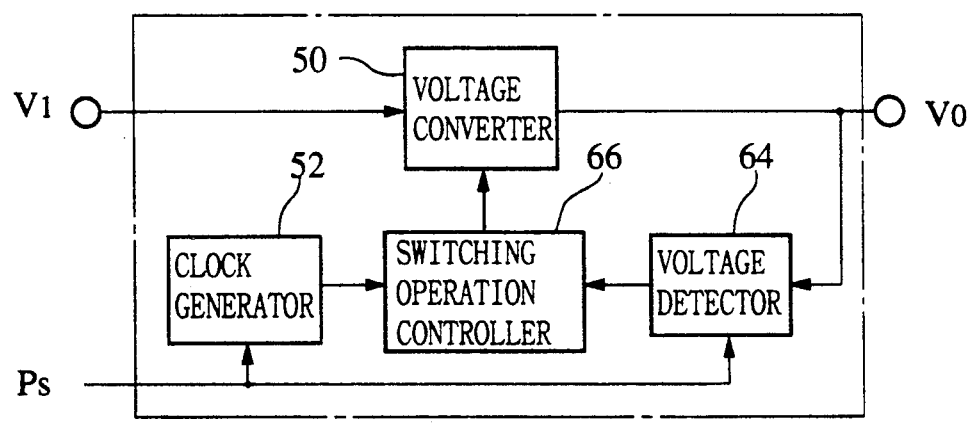
FIG. 7 and FIG. 8 are block diagrams respectively illustrating the configurations of other embodiments of the voltage converter circuit.

Further, in the voltage converter 40 shown in FIG. 7, a voltage detector circuit 64 detects the output voltage of a voltage converter circuit 50, compares the detected voltage with a reference value, and supplies the result of comparison to a switching operation controller circuit 66. The switching operation controller circuit 66 receives a clock signal from a clock generator circuit 52, supplies the clock signal to the voltage converter circuit 50 as it is when a detection signal from the voltage detector circuit 64 is lower than the reference value, and on the other hand, stops supplying the clock signal to the voltage converter circuit 50 when the detection signal from the voltage detector circuit 64 is higher than the reference value. By thus controlling a clock signal so as to be supplied or blocked correspondingly to the output voltage of the voltage converter circuit 50, the output voltage of the voltage converter circuit 50 is controlled to be a constant value.

Figure 8:
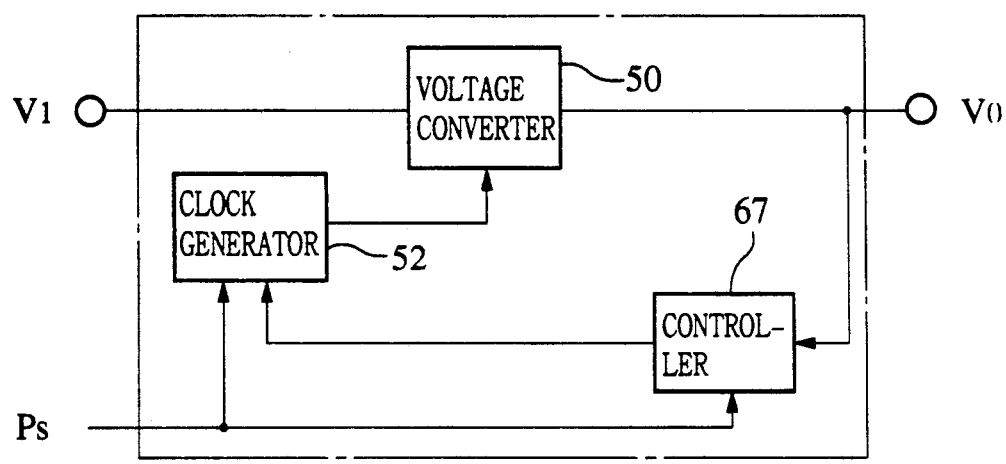

Further, in the voltage converter 40 shown in FIG. 8, a voltage detector circuit 64 detects the output voltage of a voltage converter circuit 50, compares the detected voltage with a reference value, brings a clock generator circuit 52 into an operation state or an operation inhibition state on the basis of the result of comparison, and controls the operation state (on-off operation) of the clock generator circuit 52 correspondingly to the output voltage of the voltage converter circuit 50 so as to control the output voltage of the voltage converter circuit 50 to be a constant value.

In the embodiments of FIGS. 7 and 8, the boosted voltage is controlled in the condition that no voltage is applied from the system source 18 and within the range where the boosted voltage does not become equal to or lower than the backup voltage (not lower than 3.8 V) required for reducing soft errors to thereby intend to make the power consumption low.

The function of a controller circuit 67 is not limited to the on/off control of the clock generator circuit 52, but various modifications may be considered, for example, the controller circuit 67 performs frequency control correspondingly to the output voltage of the voltage converter circuit 50, pulse width control (PWM), etc.

Figure 4:
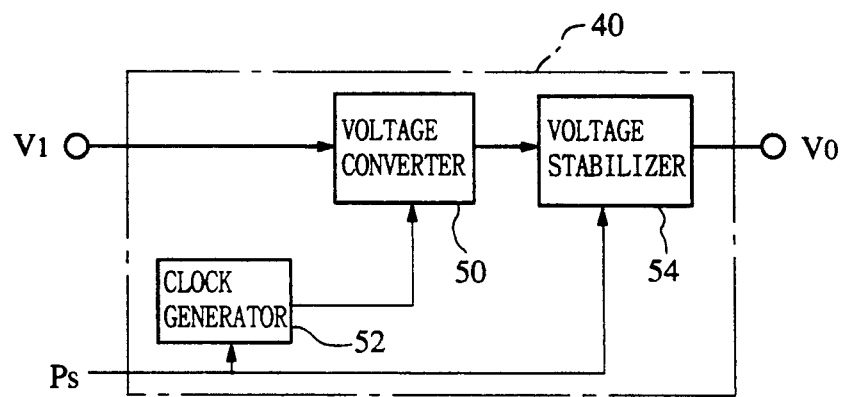
FIG. 4 is a block diagram illustrating the configuration of an embodiment of a voltage converter.
Figure 9:
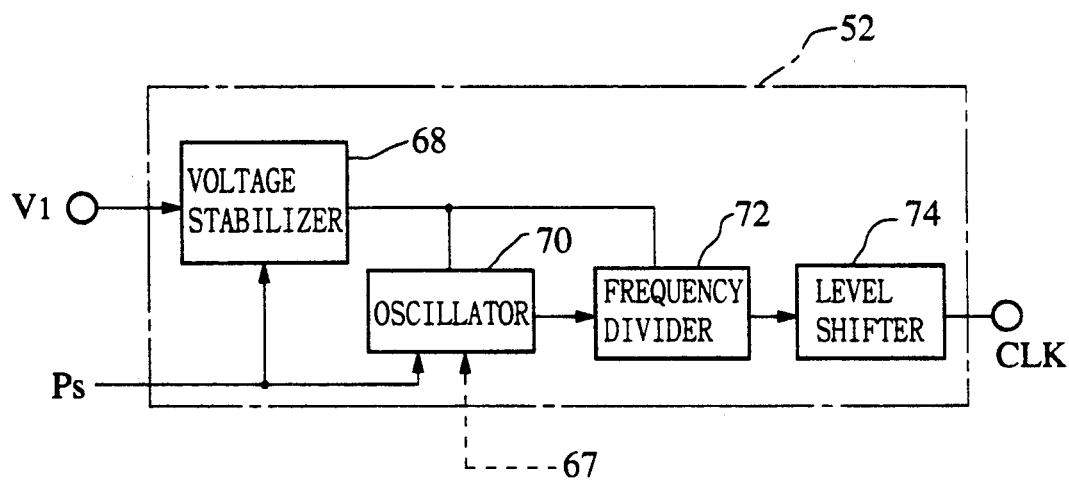
FIG. 9 is a block diagram illustrating the configuration of an embodiment of a clock generator circuit.

Further, although various configurations may be considered as the clock generator circuit 52 of FIGS. 4, 7 and 8, a low consumption type as shown in FIG. 9 is used in this embodiment.

In the clock generator circuit 52 of FIG. 9, the voltage of the battery 38 is lowered by a stabilizing source circuit 68. The voltage lowered by the stabilizing source circuit 68 is applied, as a driving voltage, onto an oscillator circuit 70 and a frequency divider circuit 72. The oscillator circuit 70 outputs an oscillating signal of a predetermined frequency, and the frequency divider circuit 72 divides the frequency of the oscillating signal. A level shifter circuit 74 shifts the level of the divisional output of the frequency divider circuit 72 and outputs the level-shifted signal as a clock signal. As has been described, the oscillator circuit 70 and the frequency divider circuit 72 are driven by a low voltage to thereby intend to make the power consumption low.

Although the RAM 36 is an example of an SRAM in the above-mentioned embodiment, the present invention can be applied to a DRAM, and in that case, a refresh circuit is added to cope with the DRAM. The voltage applied to the RAM 36 may be applied to each unit, for example, constituted by a single or a plurality of memory cells of the RAM.

Further, in the memory card according to the present invention, it is not necessary that the interface 32, the memory card interface circuit 16, the control IC 34, the switching circuit 42, the voltage converter 40, the voltage monitor 44, and so on are separated ICs. For example, the interface 32 may be dealt with as a mere connector, and the other circuit blocks may be built in the control IC 34.

INDUSTRIAL UTILITY

As the electronic appliance to which the present invention is applied, for example, there are a personal computer, a laser printer, an electronic musical instrument, a handy terminal, and so on, and the scope of application is wide.

We claim:

1. A memory card, comprising:
   a RAM, a voltage converter for boosting a voltage of a battery and outputting a boosted voltage, and a switching circuit for receiving said boosted voltage and an externally supplied voltage and supplying one of said boosted voltage and said externally supplied voltage to said RAM as a driving voltage therefor;
   said voltage converter comprising a clock signal generator circuit for generating a clock signal, a voltage converter circuit for receiving said clock signal, for said boosting of said voltage of said battery by using said clock signal as a control signal and for outputting said boosted voltage; and a control circuit for detecting said boosted voltage, comparing said boosted voltage with a predetermined standard value and controlling said clock signal generator circuit on a basis of said comparing.

2. A memory card according to claim 1, in which said switching circuit supplies a higher one of said boosted voltage and said externally supplied voltage to said RAM as said driving voltage therefor.

3. A memory card according to claim 1, in which said switching circuit supplies said externally supplied voltage to said RAM as said driving voltage therefor when said externally supplied voltage is not lower than a predetermined value.

4. A memory card according to claim 1, in which said switching circuit compares said externally supplied voltage with said voltage of said battery so as to supply said externally supplied voltage to said RAM as said driving voltage therefor when said externally supplied voltage is higher than said voltage of said battery.

5. A memory card according to claim 1, further comprising a voltage monitor for supervising said externally supplied voltage so as to bring said voltage converter into an operation inhibition mode when said externally supplied voltage is not lower than a predetermined value.

6. A memory card according to claim 1, further comprising a voltage monitor for comparing said externally supplied voltage with said voltage of said battery so as to bring said voltage converter into an operation inhibition mode when said externally supplied voltage is higher than said voltage of said battery.

7. A memory card according to claim 1, in which said voltage converter further includes a stabilizer circuit for stabilizing said boosted voltage.

8. A memory card according to claim 1, in which said control circuit controls on-off operation of said clock generator circuit.

9. A memory card according to claim 1, in which said control circuit controls a frequency of said clock signal.

10. A memory card according to claim 1, in which said control circuit controls a pulse width of said clock signal.

11. A memory card, comprising:
a RAM, a voltage converter for boosting a voltage of a battery and outputting a boosted voltage, and a switching circuit for receiving said boosted voltage and an externally supplied voltage and supplying one of said boosted voltage and said externally supplied voltage to said RAM as a driving voltage therefor;
said voltage converter comprising a clock signal generator circuit for generating a clock signal, a voltage converter circuit for receiving said clock signal, for said boosting of said voltage of said battery by using said clock signal as a control signal and for outputting said boosted voltage,
said clock signal generator circuit comprising a voltage stabilizer circuit for lowering said voltage of said battery, and an oscillator circuit driven by said voltage stabilizer circuit.

12. An electronic appliance in which a memory card is mounted and from which a driving voltage is supplied to said memory card, said memory card comprising:
a RAM, a battery, a voltage converter for boosting a voltage of said battery and outputting a boosted voltage, and a switching circuit for receiving said boosted voltage and an externally supplied voltage and supplying one of said boosted voltage and said externally supplied voltage to said RAM as a driving voltage therefor;
said voltage converter comprising a clock signal generator circuit for generating a clock signal, a voltage converter circuit for said boosting of said voltage of said battery by using said clock signal as a control signal, and a control circuit for detecting said boosted voltage, comparing it with a predetermined value and then controlling said clock signal generator circuit on a basis of a result of said comparing.

13. An electronic appliance according to claim 12, comprising an interface for transferring data between said appliance and said memory card.

14. An electronic appliance in which a memory card is mounted and from which a driving voltage is supplied to said memory card, said memory card comprising:
a RAM, a battery, a voltage converter for boosting a voltage of said battery and outputting a boosted voltage, and a switching circuit for receiving said boosted voltage and a voltage from the electronic appliance and outputting one of said boosted voltage and said voltage of said electronic appliance to said RAM as a driving voltage therefor;
said voltage converter comprising a clock signal generator circuit for generating a clock signal, a voltage converting circuit for said boosting of said voltage of said battery by using said clock signal as a control signal; and
said clock signal generator circuit comprising a voltage stabilizer circuit for lowering said voltage of said battery, and an oscillator circuit driven by said voltage stabilizer circuit.

* * * * *